United States Patent [19]

Iwatsuki

[11] Patent Number: 5,128,544

[45] Date of Patent: Jul. 7, 1992

[54] SCANNING PROBE MICROSCOPE

[75] Inventor: Masashi Iwatsuki, Mizuhomachi, Japan

[73] Assignee: Jeol Ltd., Tokyo, Japan

[21] Appl. No.: 694,923

[22] Filed: May 2, 1991

[30] Foreign Application Priority Data

May 9, 1990 [JP] Japan .................. 2-119558

[51] Int. Cl.$^5$ ............................. H01J 37/00
[52] U.S. Cl. ...................... 250/306; 250/442.11; 310/328
[58] Field of Search ............... 250/306, 423 F, 442.1; 310/328

[56] References Cited

U.S. PATENT DOCUMENTS

| | | | |
|---|---|---|---|
| 4,752,712 | 6/1988 | Tomita et al. | 310/328 |
| 4,812,698 | 3/1989 | Chida et al. | 310/328 |
| 4,841,191 | 6/1989 | Takata et al. | 310/328 |
| 4,894,538 | 1/1990 | Iwatsuki et al. | 250/306 |
| 4,906,840 | 3/1990 | Zdeblick et al. | 250/442.1 |
| 4,945,235 | 7/1990 | Nishioka et al. | 250/306 |
| 4,998,016 | 3/1991 | Nose et al. | 250/306 |

Primary Examiner—Bruce C. Anderson
Attorney, Agent, or Firm—Webb, Burden, Ziesenheim & Webb

[57] ABSTRACT

A scanning probe microscope having a tip, scanning piezoelectric units for causing the tip to scan and even-numbered z-movement piezoelectric elements for moving the tip along the z-axis. The electrodes at the outer faces of the z-movement piezoelectric elements are grounded. Thus, no AC coupling occurs between the tip and the z-axis electrode opposite to the tip. Introduction of noises into the resulting tunnel current is prevented and the image quality of the sample image is greatly improved.

4 Claims, 2 Drawing Sheets

SCANNING PROBE MICROSCOPE

FIELD OF THE INVENTION

The present invention relates to a scanning probe microscope such as a tunneling microscope or atomic force microscope.

BACKGROUND OF THE INVENTION

If a fine tip is brought close to the surface of the sample such that their spacing is on the order of a nanometer, and if a voltage is applied between the tip and the sample, then a tunnel current flows. This tunnel current changes greatly, depending on the distance between the tip and the sample. The scanning tunneling microscope (STM) accurately images the surface topography of the sample, utilizing this phenomenon. Since the atomic pattern of surfaces can be observed with an STM, it has enjoyed wide acceptance. In scanning tunneling microscopy, the tip scans the surface of the sample in two dimensions to image the surface topography as described above. During the scan, the distance between the tip and the sample is so controlled that the tunnel current is kept constant. The signal used for providing this control is also employed for displaying the topography of the sample surface. A scanning tunneling microscope of this construction is disclosed in U.S. Pat. No. 4,894,538.

FIG. 4 schematically shows the prior art scanning tunneling microscope. This instrument includes a tip 2 disposed close to the surface of a sample 1. The tip 2 is mounted to an insulating plate 4 by a conductive head 3. The insulating plate 4 is attached to a z-piezoelectric unit 5 consisting of four piezoelectric elements 5a, 5b, 5c, 5d stacked on top of each other. The z-piezoelectric unit 5 acts to drive the tip 2 in the z-direction, or vertically to the surface of the sample. The unit 5 is mounted to another insulating plate 6, which is mounted to an x-piezoelectric element 7. The x-piezoelectric element and the y-piezoelectric element 8 drive the tip 2 in the x- and y-directions, respectively, and are mounted to a grounded holding member 10 by a further insulating plate 9. Electrodes 11a–11e are provided to apply drive voltages to the z-piezoelectric elements 5a–5d. Also, electrodes 11f–11h are provided to apply drive voltages to the x-piezoelectric element 7 and the y-piezoelectric element 8. Of these electrodes, the electrodes 11b, 11d, and 11g are grounded. An xy-scanning circuit 12 is installed to operate the x-piezoelectric element 7 and the y-piezoelectric element 8. The voltage for inducing a tunnel current between the tip 2 and the sample 1 is applied by a bias power supply 15. The tunnel current is amplified by a tunnel current amplifier 14. A servo circuit 13 controls the z-piezoelectric unit 5 in such a way that the tunnel current is maintained at a constant value. A sample image is displayed on a display unit 16.

In the scanning tunneling microscope constructed in this way, an electric motor (not shown) is driven to bring the tip 2 to within about 1 nanometer of the surface of the sample 1. Then, the xy-scanning circuit 12 supplies scanning signals to the x- and y-piezoelectric elements 7, 8 to cause the tip 2 to scan the surface of the sample. During this scan, the z-piezoelectric unit 5 is controlled by the servo circuit 13 in such a manner that the tunnel current fed to the servo circuit 13 via the tunnel current amplifier 14 is kept constant. The amount of elongation or contraction of the z-piezoelectric unit 5 is controlled so that the front end of the tip 2 moves up and down while following the surface contour of the sample 1. The trajectory of the front end of the tip 2 is indicated by Q in FIG. 5. The signal supplied to the z-piezoelectric unit 5 to control it is also supplied to the display unit 16. Thus, a surface image of the sample is presented on the display unit.

In this scanning tunneling microscope, when the piezoelectric unit 5 is driven, the voltage applied between the head 3 and the electrode 11a varies. The tip 2 is attached to the head 3 made of a conductive material. The head 3 and the electrode 11a are disposed on opposite sides of the insulating plate 4. Therefore, an electrostatic capacitance that cannot be neglected exists between the tip and the electrode 11a. Because the potential imposed on the electrode 11a is controlled at a high speed so that the tunnel current may be kept constant, the voltage described above also varies at a high speed. Consequently, AC coupling exists between the tip 2 and the electrode 11 a. As a result, electrical noises are introduced into the tunnel current because of the AC coupling.

The electrode 11f is disposed opposite to the electrode 11e with the insulating plate 6 therebetween. The electrode 11h is positioned opposite to the holding member 10 with the insulating plate 9 therebetween. Since the tip 2 is driven, the potential on the electrode 11f is varied at a high speed by the xy-scanning circuit 12. On the other hand, the potential on the electrode 11e is also varied at a high speed by servo circuit 13. Again, AC coupling occurs between the electrodes 11f and 11e. The effects of the coupling are exerted on the tip via the electrode 11a connected with the electrode 11e. Similarly, AC coupling takes place between the electrode 11h and the holding member 10. The effects of this coupling are exerted on the electrode 11f connected with the electrode 11h and then on the tip through the coupling between the electrodes 11f and 11e.

Furthermore, the electric field produced around the front end of the tip fluctuates because the potentials applied to the electrodes 11a, 11e, 11f, 11h, and so forth vary. Noises are introduced into the tunnel current because of the variations of the electric field. Since the tunnel current is very feeble, the quality of the sample image is severely deteriorated by the noises introduced in this way.

SUMMARY OF THE INVENTION

It is an object of the invention to provide a scanning probe microscope which suppresses generation of the electrical noises described above, thereby providing greatly improved image quality.

It is another object of the invention to provide a scanning probe microscope which can minimize the effects of AC coupling.

The above objects are achieved in accordance with the teachings of the invention by a scanning probe microscope comprising: a tip; piezoelectric units for causing the tip to scan a sample in two dimensions; a power supply for operating the piezoelectric units; even-numbered z-movement piezoelectric elements for moving the tip along the z-axis; electrodes for applying voltages to the z-movement piezoelectric elements; a z-movement power supply for operating the z-movement piezoelectric elements; means for grounding those of the electrodes which are located at both ends; means for connecting those of the electrodes with the high-voltage terminal of the z-movement power supply which are adjacent to the grounded electrodes inside these grounded electrodes; and a display means providing a display of an image of the sample according to the image signal produced by scanning the sample with the tip.

DESCRIPTION OF THE PREFERRED EMBODIMENTS

Figure 1:
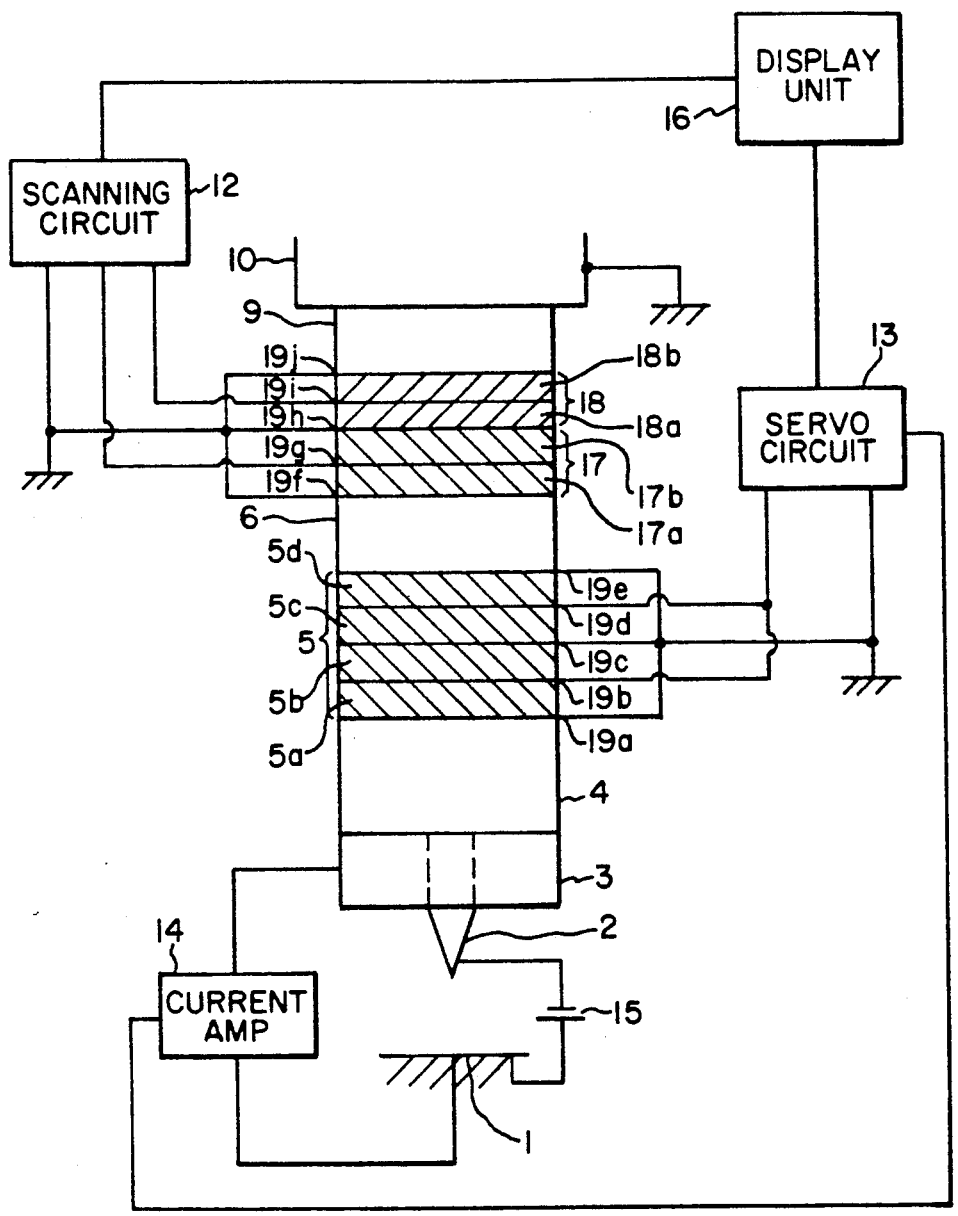
Fig. 1 is a block diagram of a scanning microscope according to the invention.
Figure 4:
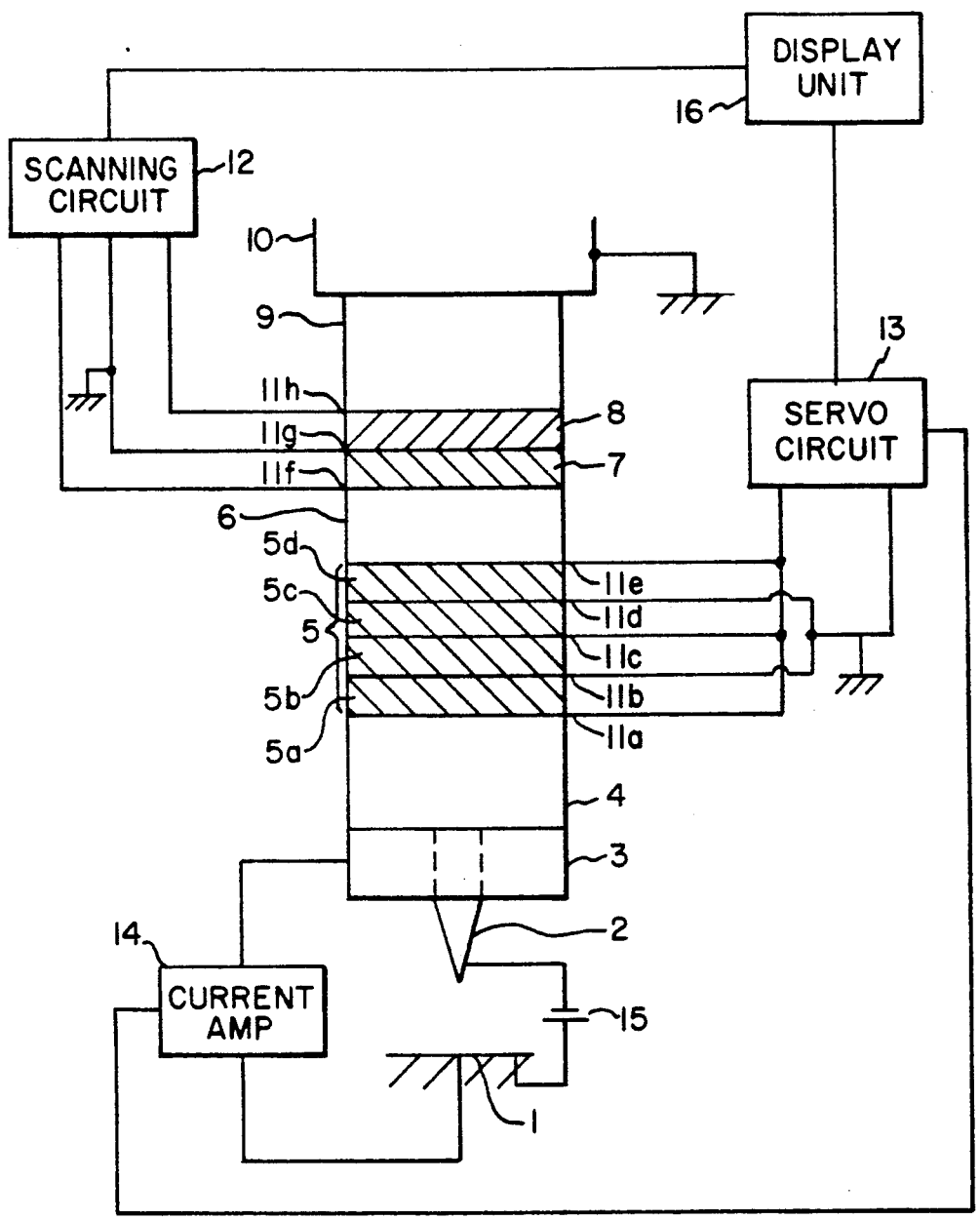
FIG. 4 is a block diagram of the prior art scanning tunneling microscope.
Figure 5:
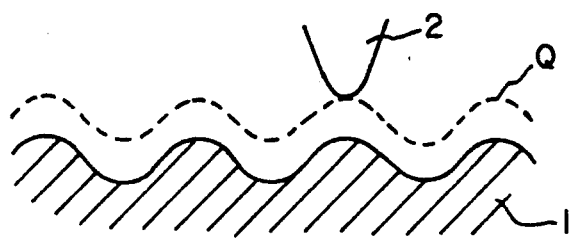
FIG. 5 is a schematic representation showing the trajectory of the probe of a scanning tunneling microscope which scans across the surface of a sample.

Referring to FIG. 1, a scanning tunneling microscope embodying the concept of the invention is schematically shown. It is to be noted that like components are indicated by like reference numerals in various figures including FIG. 4.

This microscope includes an x-piezoelectric unit 17 which consists of two piezoelectric elements 17a and 17b stacked on top of each other. This unit 17 causes a tip 2 to scan the surface of the sample 1 in the x-direction. A y-piezoelectric unit 18 for causing the tip 2 to scan the surface of the sample 1 in the y-direction consists of two piezoelectric elements 18a and 18b stacked on top of each other. Electrodes 19a–19e apply drive voltages to z-piezoelectric elements 5a–5d of a z-piezoelectric unit 5. Of these electrodes 19a–19 e, the electrodes 19a and 19e at both ends are grounded. The inner electrodes 19b and 19d adjacent to these electrodes 19a and 19e at both ends are supplied with high potentials from a servo circuit 13 to drive the elements. Therefore, the electrode 19c is grounded to drive the elements 5b and 5c. Electrodes 19f, 9g, and 19h apply voltages to the x-piezoelectric elements 17a and 17b. Of these electrodes, the electrodes 19f and 19h at both ends are grounded. On the other hand, the electrode 19g which is adjacent to the grounded electrode 19f inside the electrodes 19f and 19h is applied with a high potential from an xy-scanning circuit 12 to make an x scan. Likewise, electrodes 19h, 19i, 19j are used to apply voltages to the y-piezoelectric elements 18a and 18b. The electrode 19h is one of the two end electrodes of the y-piezoelectric unit 18. As already described, the electrode 19h is grounded. The other electrode 19j of the two end electrodes of the y-piezoelectric unit 18 is also grounded. The xy-scanning circuit 12 applies a high potential to the electrode 19i neighboring the electrode 19j to make a scan in the y-direction.

In the operation of this scanning tunneling microscope, scanning signals are applied to the x- and y-piezoelectric units 17 and 18, respectively, from the xy-scanning circuit 12 to cause the tip 2 to scan the surface of the sample. As a result, a tunnel current flows through the tip 2. This current is amplified by the tunnel current amplifier 14. The servo circuit 13 controls the drive voltage applied to the z-piezoelectric unit 5 so that the output current from the amplifier 14 is held constant. At this time, a voltage is developed between the tip 2 and the electrode 19a, since the bias power supply 15 applies a given potential to the tip 2. However, this voltage between the tip 2 and the electrode 19a does not vary, because the electrode 19a is grounded. For this reason, no AC coupling occurs between the tip 2 and the electrode 19a. As a result, no electrical noises are introduced into the tunnel current.

Moreover, no AC coupling takes place between the electrodes 19e and 19f even during the operation of the scanning tunneling microscope, since these electrodes 19e and 19f holding the insulating plate 6 therebetween vertically are grounded. Also, the holding member 10 and the electrode 19j which hold the insulating plate 9 therebetween vertically are grounded and so the voltage between them does not vary. Therefore, no AC coupling occurs between the holding member 10 and the electrode 19j.

The outer surfaces of the z-piezoelectric unit 5, the x-piezoelectric unit 17, and the y-piezoelectric unit 8 are surrounded by grounded electrodes. Accordingly, the electric field produced around the tip 2 does not vary even though the potentials impressed on the electrodes 19b, 19d, 19g, and 19i vary. This also prevents the aforementioned introduction of noises. In this way, in accordance with the invention, an accurate sample image which is free from the effects of the above-described noises can be displayed on the display unit.

Figure 2:
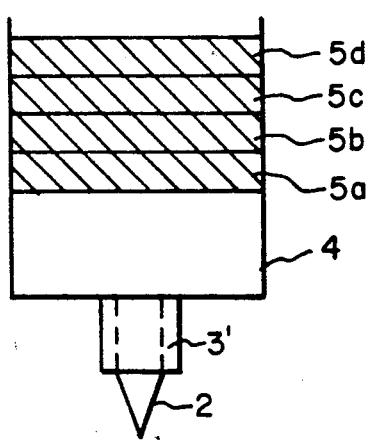
FIG. 2 is a side elevation of main portions of another scanning tunneling microscope according to the invention.

FIG. 2 shows main portions of another scanning tunneling microscope according to the invention. This instrument is similar to the instrument already described in connection with FIG. 1 except that the area of the portion of a head, indicated by 3', which is opposite to the electrode 19a (see FIG. 1) is made smaller than the area of the electrode 19a. The electrostatic capacitance between the tip 2 and the electrode 19a can be rendered smaller than heretofore. Hence, the AC coupling occurring between the tip 2 and the electrode 19a can be even better suppressed than in the example shown in FIG. 1.

Figure 3:
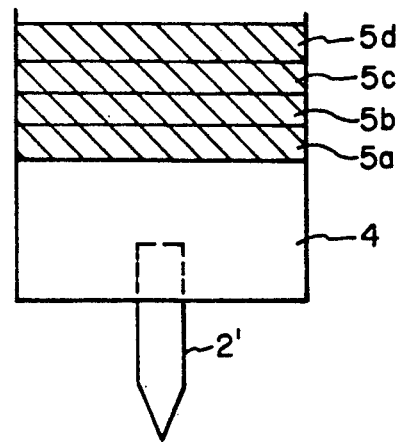
FIG. 3 is a side elevation of main portions of a further scanning tunneling microscope according to the invention.

Referring next to FIG. 3, there is shown a further scanning tunneling microscope according to the invention. This instrument is similar to the instrument shown in FIG. 1 except that the head is omitted and that a tip, denoted by 2', is directly buried in the insulating plate 4. The electrostatic capacitance between the tip 2'and the electrode 19a is smaller than in the example shown in FIG. 2. Hence, the AC coupling between the tip and the electrode 19a can be suppressed further.

In the above examples, the invention is applied to a scanning tunneling microscope. It is to be understood that the application of the invention is not limited to this kind of apparatus. For example, the invention can be applied to an atomic force microscope.

Also in the above examples, the potential applied to the sample 1 is made lower than that applied to the tip 2. It is also possible to apply potentials of opposite polarities to them. Furthermore, in the above examples, the piezoelectric elements 5a, 5b, etc. are stacked on top of each other. Concomitantly, the electrode 19b and so forth act also as drive electrodes for operating these two piezoelectric elements. Alternatively, an insulating member is disposed between the piezoelectric elements 5a and 5b, and the electrode 19a is divided into two separate portions.

Having thus described the invention with the detail and particularity required by the Patent Laws, what is claimed and desired to be protected by Letters Patent is set forth in the following claims.

What is claimed is:

1. A scanning probe microscope comprising:
   a) a tip;
   b) a z-movement piezoelectric unit for moving the tip along a z-axis and x-scanning and y-scanning piezoelectric units for scanning a sample in two dimensions, said z-movement piezoelectric unit comprising a plurality of z-movement piezoelectric elements each having opposite faces and being stacked face to face, there being an even-number of z-movement piezoelectric elements;
   c) electrodes for applying voltages to the faces of the z-movement piezoelectric elements;
   d) a power supply for operating the piezoelectric units, said supply having a high-voltage terminal for operating the z-movement piezoelectric elements;
   e) means for grounding those of the electrodes which are located at both outer end faces of the z-movement piezoelectric unit and spaced electrodes at faces within the z-movement piezoelectric unit;
   f) means for connecting those of the electrodes within the z-movement piezoelectric unit which are not grounded with the high-voltage terminal for operating the z-movement piezoelectric elements; and
   g) a display means providing a display of an image of the sample according to an image signal produced by scanning the sample with the tip.

2. The scanning probe microscope of claim 1, wherein
   h) the x-scanning and y-scanning piezoelectric units for causing the tip to scan a sample comprise even-numbered x-scanning piezoelectric elements for making x-scans and even-numbered y-scanning piezoelectric elements for making y-scans;
   i) there being x-scanning electrodes for applying voltages to the x-scanning piezoelectric elements;
   j) there being y-scanning electrodes for applying voltages to the y-scanning piezoelectric elements;
   k) those of the x-scanning electrodes which are located at the outer faces of the x-scanning piezoelectric unit and spaced electrodes at faces within the piezoelectric unit being grounded;
   l) the power supply for operating the piezoelectric units being connected to apply high-voltages to the x-scanning electrodes which are not grounded;
   m) those of the y-scanning electrodes which are located at the outer faces of the y-scanning piezoelectric unit and spaced electrodes at faces within the piezoelectric unit being grounded; and
   n) the power supply for operating the piezoelectric units being connected to apply high voltages to the y-scanning electrodes which are not grounded.

3. The scanning probe microscope of claim 1, wherein there are further provided an insulating member connected with that of said z-movement piezoelectric unit which is located at one end and a head used to attach the tip to the front end of the insulating member, and wherein the area of the portion of the head opposite to the electrode at said one end is made smaller than the area of this electrode to reduce the electrostatic capacitance produced between this electrode and the tip.

4. The scanning probe microscope of claim 1, wherein there is further provided an insulting member connected with that of said z-movement piezoelectric unit which is located at one end, and wherein the tip is directly connected with the insulating member to reduce the electrostatic capacitance between the electrode at said one end and the tip.

* * * * *

UNITED STATES PATENT AND TRADEMARK OFFICE
CERTIFICATE OF CORRECTION

PATENT NO. : 5,128,544
DATED : July 7, 1992
INVENTOR(S) : Masashi Iwatsuki

It is certified that error appears in the above-identified patent and that said Letters Patent is hereby corrected as shown below:

Cover page, after [73] Assignee: "Jeol" should read --JEOL--.

Column 1 Line 39 after "element" (second occurrence) insert --7--.

Column 2 Line 14 after "tip" insert --2--.

Column 2 Line 19 "11 a." should read --11a.--.

Column 3 Line 8 after "scanning" insert --tunneling--.

Column 3 Line 38 "19a-19 e," should read --19a-19e,--.

Column 3 Line 44 "9g," should read --19g,--.

Column 4 Line 20 "8" should read --18--.

Signed and Sealed this

Twenty-fourth Day of August, 1993

Attest:

BRUCE LEHMAN

*Attesting Officer*     *Commissioner of Patents and Trademarks*